United States Patent [19]

Momoi et al.

[11] 3,786,318

[45] Jan. 15, 1974

[54] SEMICONDUCTOR DEVICE HAVING CHANNEL PREVENTING STRUCTURE

[75] Inventors: Toshimitu Momoi, Tokyo; Isamu Homma, Hokkaido, both of Japan

[73] Assignee: Hitachi, Ltd., Tokyo, Japan

[22] Filed: Oct. 10, 1967

[21] Appl. No.: 674,236

[30] Foreign Application Priority Data

Oct. 14, 1966 Japan ................................ 41/67125

[52] U.S. Cl.... 317/235 R, 317/235 G, 317/235 AG
[51] Int. Cl. ............................................ H01l 19/00
[58] Field of Search ......................... 317/235, 101 A

[56] References Cited

UNITED STATES PATENTS 3,315,096 4/1967 Carlson et al. ....................... 317/235

FOREIGN PATENTS OR APPLICATIONS 1,015,588 1/1966 Great Britain ...................... 317/235

OTHER PUBLICATIONS

IBM Tech. Discl. Bul., "Insulating Lateral Surfaces on Semiconductor Chips" by Lehman et al. Vol. 7, No. 12, May 1965 pages 1216–1217.

SCP and Solid State Technology, "Causes, Effects, and a Cure for Channeling in Silicon Planar Transistors" by Coppen, July 1965 pages 20–23.

*Primary Examiner*—Jerry D. Craig
*Attorney*—Craig, Antonelli & Hill

[57] ABSTRACT

A semiconductor device, wherein a plurality of light doped p-type silicon regions are formed separately in an island form on a heavily doped $P^+$ type silicon substrate in contact therewith, semiconductor circuit elements like diodes, transistors, resistors, capacitors etc. are formed in the principal surfaces of the $P^-$ regions and the exposed surface parts of the $P^+$ substrate and $P^-$ regions are covered with silicon oxide films. This invention provides a stabilized semiconductor device capable of high voltage operation, wherein the leakage current is small and the interaction between the circuits elements is small.

4 Claims, 22 Drawing Figures

Figures 1A, 1B, 2A, 2B:
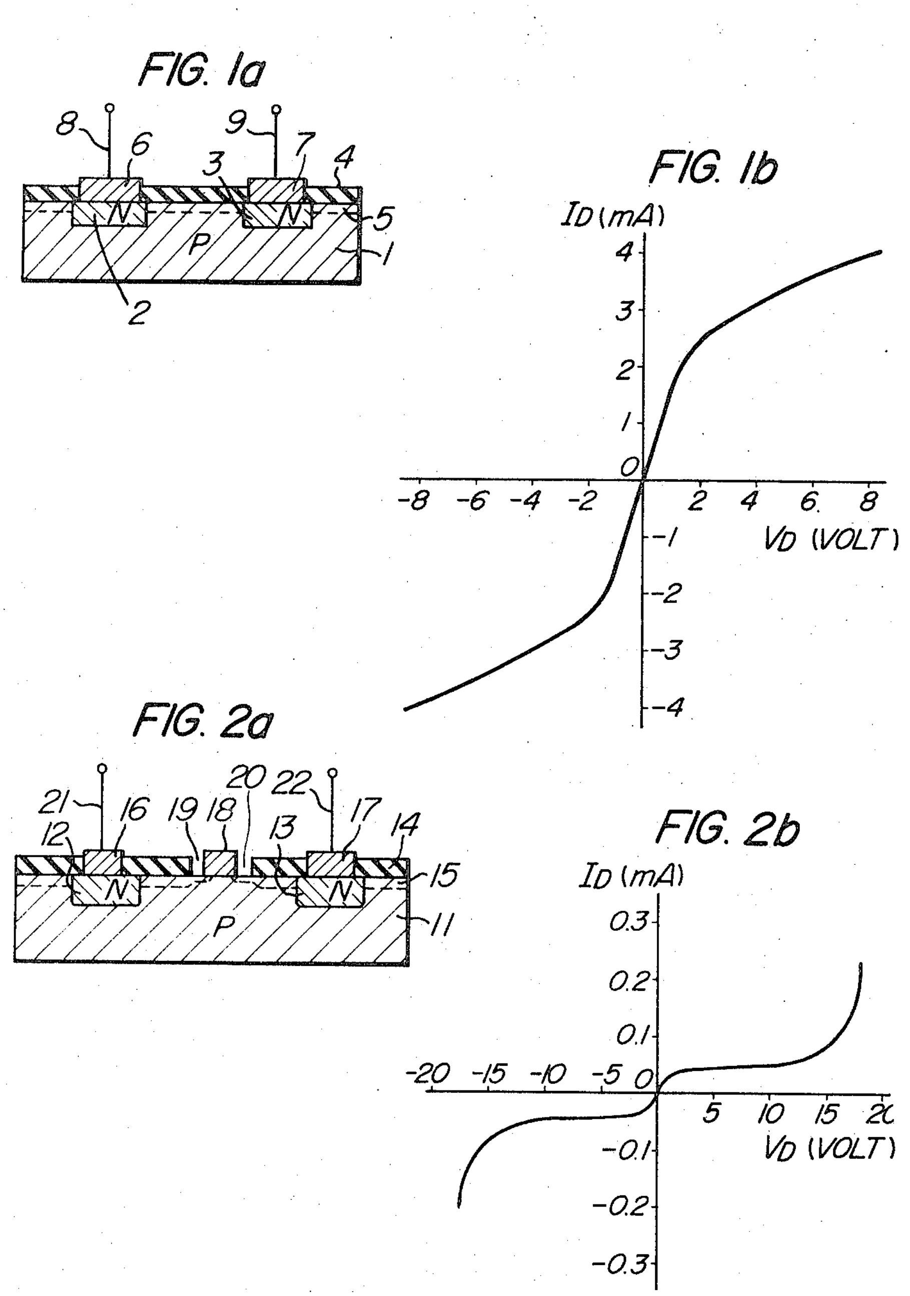

INVENTORS
YOSHIMITO HORAI
ISAMU HOMMA

BY Craig & Antonelli
ATTORNEYS

INVENTORS
TOSHIMITO MOMOI
ISAMU HOMMA

BY

ATTORNEYS

INVENTORS
TOSHIMITO MOMOI
ISAMU HOMMA

BY Craig & Antonelli
ATTORNEYS

INVENTORS
TOSHIMITO MOMOI
ISAMU HOMMA

BY [signature]
ATTORNEYS

SEMICONDUCTOR DEVICE HAVING CHANNEL PREVENTING STRUCTURE

This invention relates to stabilized semiconductor devices and more particularly to a method of fabricating stabilized junction diodes, transistors and semiconductor integrated circuit devices suitable for high voltage operation.

Conventionally, in order to prevent the electrical characteristics of a semiconductor device from being influenced by the outer atmosphere, the surfaces of a semiconductor substrate are covered with insulating films like silicon dioxide films and thereby the terminal parts of the P–N junction exposed at the semiconductor substrate surface are passivated.

However, in such a passivated semiconductor device, an N-type surface layer is induced in the substrate surface by the silicon dioxide film provided at the substrate surface (this is a physical phenomenon known as "channeling"), and thus the operating voltage may be limited or the inverse leakage current of PN junction may be increased. Moreover, since the induced layer is likely to be influenced by the outer atmosphere, the electrical characteristics of the semiconductor device are also influenced by the outer conditions. Further, since the circuit elements like diodes, transistors, resistors, capacitors etc. formed adjacently in the substrate are coupled closely by the induced layer in a semiconductor integrated circuit device, it becomes impossible for each circuit element to achieve its independent circuit function.

For example, in a depletion mode N-channel insulated gate type field effect transistor, the N-type surface layer induced in the semiconductor substrate surface covered with insulating layers is exposed at the side surface of the semiconductor substrate and thereby there arises such defects as the increase of the leakage current, the limitation of the operating voltage and the lowering of the reliability. To be more specific, such transistor is composed by forming N-type source and drain regions through the selective diffusion of N-type impurity like phosphorus into a P-type silicon substrate having a relatively high specific resistance of about 2 – 5 Ω-cm and forming a gate electrode on a silicon dioxide layer provided on the substrate surface between the regions, and the N-type surface layer or the inversion layer induced in the substrate surface under the electrode by the silicon dioxide layer is made to serve as a channel region or a carrier path of a transistor. Since the substrate surfaces other than the surfaces where the source, drain and channel regions are provided are also covered with the silicon dioxide layers, N-type induced surface layers are also formed in the P-type substrate surfaces. The latter induced surface layers degrades the electrical characteristics of the transistor.

A countermeasure to prevent this degradation is to provide a ring-shaped highly doped $P^+$ diffused region surrounding the source, drain and channel regions in a semiconductor substrate surface and thereby to prevent the induced N-type surface layer from being exposed and improve the electrical characteristics of the device. In this method, however, P-type impurity like boron must be diffused to provide the $P^+$ region and the manufacturing process of the transistor becomes more complicated. Further, since the N-type diffused regions composing the source and drain regions are affected by the heat treatment at the time of the $P^+$ diffusion, it becomes-difficult to define the channel width between the source region and the drain region accurately. Therefore, such prior art method of providing a ring-shaped $P^+$ diffused region is not always the best way to overcome these defects.

This invention is primarily intended to obviate the deficiencies described hereinabove. The invention can also be applied to the other semiconductor devices like diodes, bipolar transistors, semiconductor integrated devices etc., and according to this invention, it becomes feasible to provide a semiconductor device which is stable and capable of high voltage operation.

Accordingly, an object of this invention is to provide improved and stabilized semiconductor devices for high voltage operation.

Another object of the invention is to provide a method of fabricating such improved and stabilized semiconductor devices.

A further object of the invention is to provide improved diodes and transistors wherein the leakage current is small.

A still further object of the invention is to provide improved insulated gate type field effect transistors having a small leakage current.

A further object of the invention is to provide a depletion mode N-channel insulated gate type field effect transistor having a small surface leakage current and an improved fabricating method thereof.

Another object of the invention is to provide a semiconductor integrated circuit device having improved electrical characteristics.

This invention is intended to achieve the above objects and a semiconductor device according to one embodiment of the invention comprises a semiconductor body consisting of a highly doped $P^+$ semiconductor region and a lowly doped $P^-$ semiconductor region provided on the $P^+$ region, the $P^-$ region having a principal surface; a semiconductor circuit element formed in the principal surface of the $P^-$ region; a ditch provided at the outside of the circuit element in the surface of the semiconductor body in a way to surround the circuit element extending to the $P^+$ region; and an insulating film covering the surfaces of the exposed $P^+$ region and $P^-$ region.

In a semiconductor device according to one embodiment of the invention, the induced surface layer formed in the surface of the $P^-$ region is intercepted by the ditch extending to the $P^+$ region and the exposure of the induced layer can be prevented. In a semiconductor integrated circuit device, the induced surface layer connecting the circuit element and a second circuit element provided in the second $P^-$ region different from the $P^-$ region is intercepted by the ditch and thus the undesirable interaction between the two circuit elements can be prevented. Further, when fabricating the semiconductor device according to one embodiment of the invention, it is not required to form a highly doped $P^+$ region by diffusing P-type impurity in order to intercept the induced surface layer due to the channeling phenomenon, but only a ditch is formed. Therefore, the manufacturing process becomes quite simple.

Figure 3A:
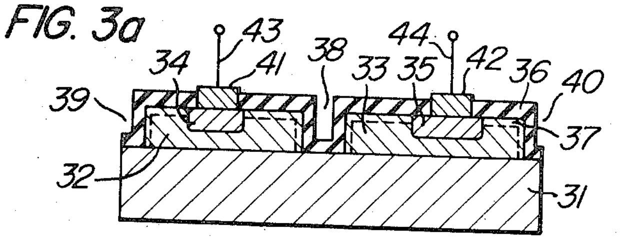
Figure 3B:
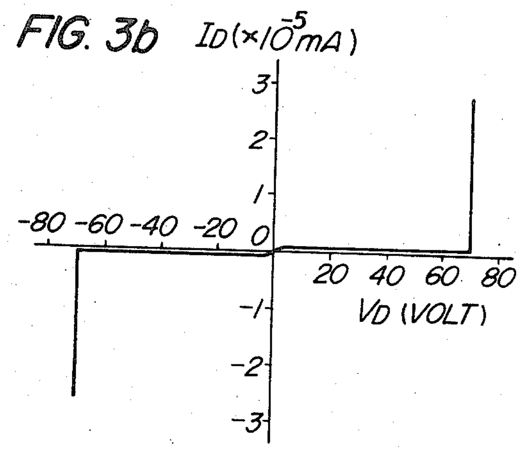
Figure 4:
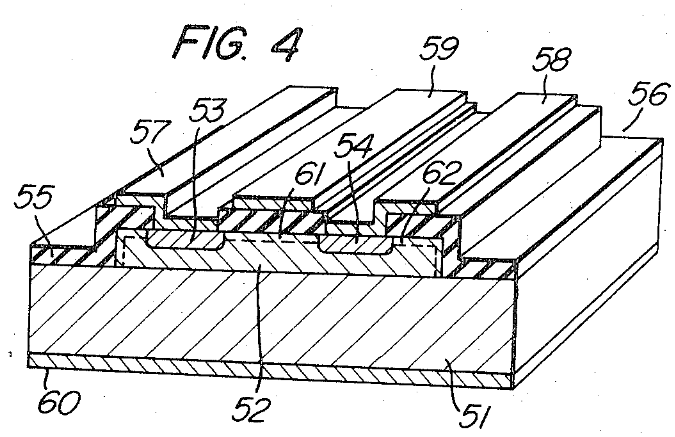
Figures 5A, 5B, 5C, 5D, 5E, 5F, 6A, 6B, 6C:
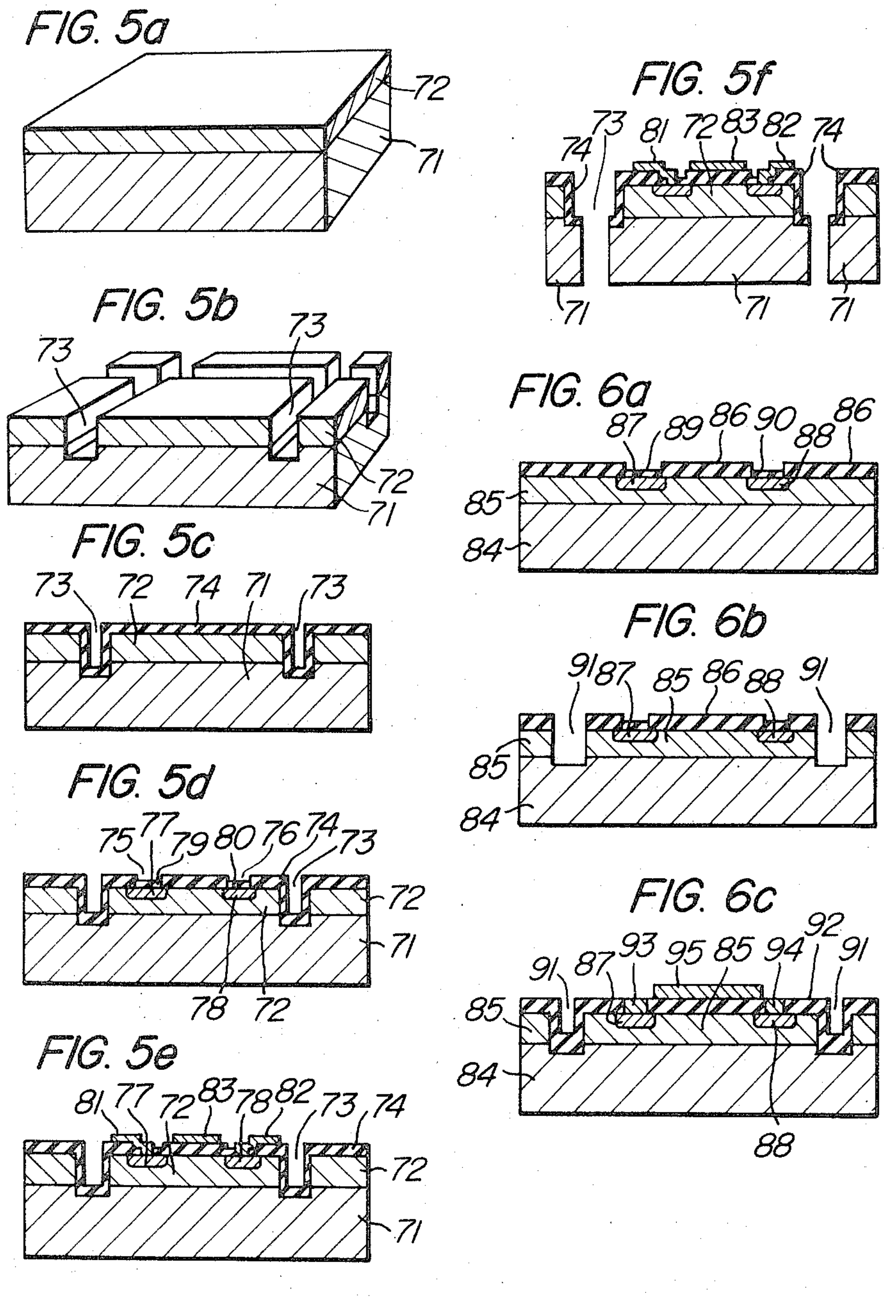
Figures 7A, 7B, 7C, 8, 9, 10:
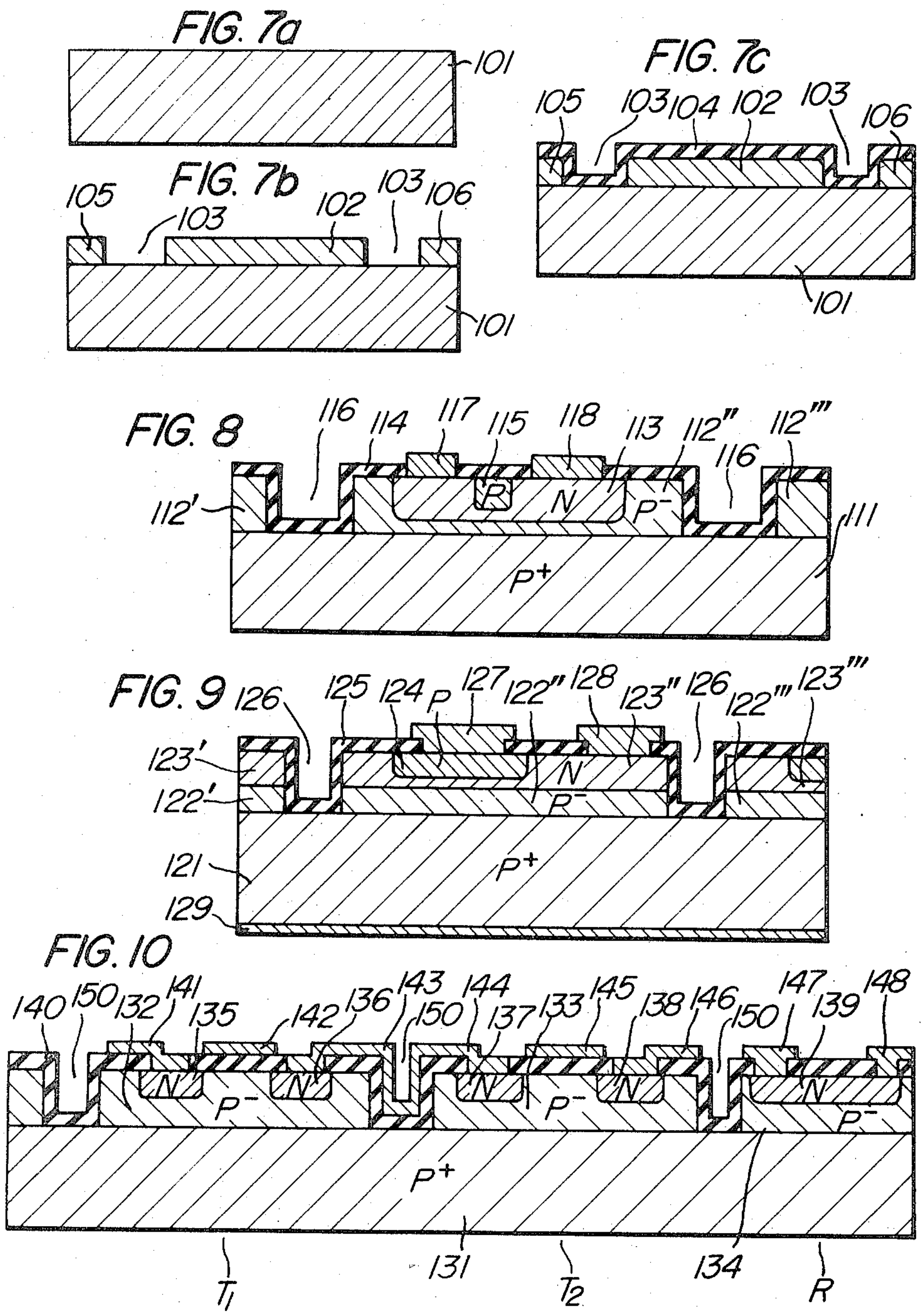

This invention will be described in more detail hereinbelow with reference to the accompanying drawings wherein:

FIGS. 1*a* and 1*b* show a longitudinal sectional diagram and an electrical characteristic diagram of a semiconductor device presented for the explanation of this invention, FIGS. 2*a* and 2*b* also show a longitudinal sectional diagram and an electrical characteristic diagram of another semiconductor device presented for the explanation of the invention, FIGS. 3*a* and 3*b* show a longitudinal sectional diagram and an electrical characteristic diagram of a semiconductor device according to an embodiment of this invention, FIG. 4 is a fragmentary oblique sectional view of an insulated gate type field effect transistor according to an embodiment of the invention, FIGS. 5*a* through 5*f* are longitudinal sectional views of the transistor shown in FIG. 4 at each step of the manufacturing process, presented for the illustration of a method of fabricating the transistor, FIGS. 6*a* through 6*c* are sectional views of the transistor shown in FIG. 4 at each step of the manufacturing process presented for the illustration of another method of making the transistor, FIGS. 7*a* through 7*c* are sectional views of a semiconductor device at each step of the manufacturing process presented for illustrating a further manufacturing method, FIG. 8 is a longitudinal sectional view of a junction type field effect transistor according to another embodiment of the invention, FIG. 9 is a longitudinal sectional view of a P-N-P transistor according to a further embodiment of the invention, and FIG. 10 is a longitudinal sectional view of a semiconductor integrated device according to a still further embodiment of the invention.

The improved electrical characteristics of a semiconductor device according to the invention will now be described in the first place with reference to FIGS. 1*a*, 1*b*, 2*a*, 2*b*, 3*a* and 3*b*.

FIG. 1*a* shows a semiconductor device, wherein a silicon dioxide film 4 having a thickness of about 1,500 A is provided on the surface of a P-type silicon substrate 1 having a specific resistance of 3 – 5 Ω-cm, two holes separated by about 20 μ are formed in the film 4, N-type regions 2 and 3 having a depth of about 3 μ are formed by diffusing N-type impurity like phosphorus through the holes into the substrate 1 and metal electrodes 6 and 7 made, for example, of aluminum which are in ohmic contact with the regions are provided. In such a semiconductor device, an N-type surface layer 5 is induced in the surface of the substrate 1 by the silicon dioxide film 4 as described hereinabove, and the two N-type diffused regions 2 and 3 become electrically connected or coupled by the induced surface layer 5.

Therefore, the present inventors provided outgoing leads 8 and 9 connected to the electrodes 6 and 7 and measured the V – I characteristic between the outgoing leads 8 and 9. Then, the result as shown in FIG. 1*b* was obtained. In the same figure, the abscissa denotes the voltage applied between the leads 8 and 9 and the ordinate shows the electric current running between the leads 8 and 9. It is seen from the figure that as the applied voltage increases, the electric current also increases and that a current of about 4 mA flows when a voltage of 8 V is applied.

Then, the Inventors made a semiconductor device as shown in FIG. 2*a* to separate the coupling between the two regions 2 and 3 caused by the induced surface layer and measured the V - I characteristic between the leads 21 and 22. Then, the result as shown in FIG. 2b was obtained. A semiconductor device shown in FIG. 2*a* is fabricated by providing a silicon dioxide film 14 on the surface of a P-type silicon substrate 11 having a resistivity of 3 – 5 Ω-cm, forming N-type diffused regions 12 and 13 mutually separated by about 100 μ according to a conventional method of selective diffusion, eliminating a part of the silicon dioxide film 14 provided between the two regions 12 and 13 and then forming metal layers 16, 17 and 18 by depositing metal like Al. In this case, it is preferable to extend the metal layer 18 over the substrate surface between the N-type diffused regions 12 and 13 and separate the same metal layer 18 from at least a part of the silicon dioxide film 14. In FIG. 2*a*, the case wherein the metal layer 18 is completely separated from the silicon dioxide layer 14 by the holes 19 and 20. As is seen from the V - I characteristic shown in FIG. 2*b*, the electric current flowing between the two diffused regions 12 and 13 decreases considerably in such a semiconductor device compared with the semiconductor device explained in FIG. 1*a*. However, when the applied voltage is 10 V, the electric current of about 0.05 mA flows and when the applied voltage increases above 18 V, the electric current increases drastically. It is to be noted that the leakage current is smaller in a semiconductor device shown in FIG. 2*a* than in a semiconductor device illustrated in FIG. 1*a*. The reason is perhaps ascribed to the fact that the induced surface layer 15 is drastically reduced by the parts 19 and 20 and the aluminum layer 18 in a device shown in FIG. 2*a*.

Based on these two experiments, the present Inventors proposed a novel semiconductor device according to this invention as shown in FIG. 3*a* and repeated further detailed experiments. As a result, the Inventors invented a semiconductor device having excellent electrical characteristics as shown in FIG. 3*b*. Namely, the Inventors succeeded in providing a semiconductor device having a high reliability characteristic and a very small leakage current below $10^{-6}$ mA for a wide range of the operating voltage of 0 – 70 V. A semiconductor device shown in FIG. 3*a* consists of a highly doped $P^+$-type silicon substrate 31; $P^-$ silicon protruding parts provided on said substrate in a mutually separated fashion or island shaped $P^-$ silicon regions 32 and 33; N-type diffused regions 34 and 35 formed in the principal surfaces of the $P^-$ silicon regions 32 and 33, a silicon oxide film 36 covering the surfaces of the $P^+$ substrate, $P^-$ regions and N regions; and metal electrodes 41 and 42 made, for instance, of Al and provided in ohmic contact with the N regions 34 and 35. In order to obtain the semiconductor device according to this invention, the present Inventors used a silicon wafer having a specific resistance of about 0.002 Ω-cm and a thickness of about 200 μ as the $P^+$ substrate 31, formed a $P^-$ silicon layer having a specific resistance of about 3 – 5 μ-cm and a thickness of about 5 μ on the wafer by a conventional epitaxial method, formed a ditch 38 of about 20 μ in width reaching the $P^+$ substrate 31 by selectively etching the $P^-$ layer according to conventional photoetching technique, formed thereby $P^-$ regions 32 and 33 remaining on the $P^+$ substrate 31 in an island form (however, in FIG. 3*a*, the ditches 39 and 40 are formed in continuation with the ditch 38 and surround the $P^-$ regions 32 and 33), then formed a silicon oxide film 36 of about 1,500 – 3,000 A in thickness on the surfaces of said exposed $P^+$ substrate and $P^-$ regions by heating in an oxygen atmosphere, provided holes in the film 36 formed on the surface of the $P^-$ regions, formed N-type diffused regions 34 and 35 having a depth of about 1 – 2 $\mu$ and the surface impurity concentration of about $10^{20}$ atoms/cm$^3$ separated by about 100 $\mu$ by diffusing N-type impurity like phosphorus through said holes into the $P^-$ regions, and further provided electrodes 41 and 42 in ohmic contact the N regions 34 and 35 by evaporating Al. When the V - I characteristic between the electrodes 41 and 42 was measured in a semiconductor device provided in this way, the result as shown in FIG. 3*b* explained hereinbefore was obtained.

The reason why the leakage current is remarkably small and the reliability characteristic is excellent in a semiconductor device according to this invention compared with the devices explained in FIGS. 1*a* and 2*a* is considered to be the following. The first reason is that since the induced surface layer 37 due to channeling effect is terminated at the highly doped $P^-$ substrate by the ditch 38 as shown in FIG. 3*a*, the undesirable surface layer which couples the $P^-$ regions 32 and 33 is not formed. The second reason is that the ditches 39 and 40 are provided also at the side surfaces of the semiconductor device and thus the induced surface layer 37 does not expose itself.

Through further experiments by the present Inventors, it was found that the resistivity of the $P^+$ substrate must be 0.1 Ω-cm or less and preferably 0.01 Ω-cm or less to perform this invention.

Now, various semiconductor devices embodying the present invention will be described in detail hereinbelow.

EXAMPLE 1

FIG. 4 shows a fragmentary oblique sectional diagram of a depletion mode N- channel insulated gate type field effect transistor according to this invention. In FIG. 4, reference numeral 51 indicates a highly doped $P^+$ silicon substrate having a specific resistance of 0.001 Ω-cm and a thickness of about 250 $\mu$; 52 shows a $P^-$ island region or protruding region having a specific resistance of 1 Ω-cm and a thickness of 5 $\mu$ provided on the substrate 51; 53 and 54 designates N-type regions of about 2 $\mu$ in depth formed in the surface of the $P^-$ island region 52, the regions 53 and 54 composing a source and a drain region of a transistor, respectively; 55 indicates a silicon oxide film of about 3,000 A in thickness covering the surfaces of the $P^+$ substrate and the regions; 57 and 58 are metal electrodes provided on the source and drain regions 53 and 54, respectively, each composing a source and a drain electrodes; 61 and 62 are N-type surface layers induced in the surface of said $P^-$ region 52 by said film 55, among which particularly 61 is operating as a channel region of a transistor; 59 is a gate electrode provided on the silicon oxide film on the channel region 61; and 56 is a ditch or a groove surrounding the transistor and reaching the substrate surface.

In a transistor as shown in FIG. 4, since the surface layer 62 formed on the surface of the $P^-$ region 52 is terminated at the $P^+$ substrate 51, the leakage current running between the source region 53 and the drain region 54 is quite small and accordingly the "off resistance" of the transistor becomes quite large. Therefore, since the ratio "off resistance"/"on resistance" is large in a transistor having this structure, the transistor works as an analog chopper at the low voltage level and thus it has a wide range of application.

Now, a method of fabricating a transistor which has a structure as shown in FIG. 4 will be described with reference to FIGS. 5*a* through 5*f*.

In the first step, as shown in FIG. 5*a*, a $P^+$ silicon substrate 71 of 0.001 Ω-cm in specific resistance and 250 $\mu$ in thickness is prepared and a $P^-$ silicon layer 72 of 1 Ω-cm in specific resistance and 5 $\mu$ in thickness is formed on the substrate by a conventional epitaxial growth method whereby $SiCl_4$ is reduced by $H_2$. Then, the $P^-$ layer 72 is selectively etched by conventional photo-etching technique as shown in FIG. 5*b* to form a ditch 73 reaching the $P^+$ substrate 71. Next, the whole body is subjected to heat treatment at about 1,000°C. for 30 minutes in oxygen atmosphere to form a silicon oxide film 74 of about 3,000 A in thickness on the surface of the $P^+$ substrate and the $P^-$ layer as shown in FIG. 5*c*. Then, holes 75 and 76 are provided in the film on the $P^-$ layer 72 by conventional photo-etching technique and N-type diffused regions 77 and 78 are formed by diffusing phosphorus through the holes into the $P^-$ layer as shown in FIG. 5*d*. At this step of diffusion, novel silicon oxide films 79 and 80 having a thickness of about 1,500 – 2,000 A are formed on the diffused regions 77 and 78. Then, as shown in FIG. 5*e*, holes reaching the N-type diffused regions 77 and 78 are provided in the newly formed films 79 and 80 and a source electrode 81, a drain electrode 82 and a gate electrode 83 are formed by Al evaporation. Finally, the body is divided into individual transistors as shown in FIG. 5*f* by scribing the substrate 71 along the ditch 73.

Now, another method of fabricating a transistor according to the invention as shown in FIG. 4 will be explained with reference to FIGS. 6*a* through 6*c*.

FIG. 6*a:* A $P^-$ silicon layer 85 of 1 Ω-cm in specific resistance and about 5 $\mu$ in thickness is epitaxially deposited on a $P^+$ silicon substrate 84 of 0.001 Ω-cm in specific resistance, a silicon oxide film 86 of about 4,000 A in thickness is formed on a principal surface of the $P^-$ layer 85 and N-type diffused regions 87 and 88 are formed by selectively doping phosphorus into the $P^-$ layer 85 according to a conventional method of selective diffusion.

FIG. 6*b:* A ditch 91 extending to the $P^-$ substrate 84 is provided in the $P^-$ layer 85 by conventional photo-etching technique, supersonic processing or scratching and the $P^-$ layer 85 is divided into a plurality of parts.

FIG. 6*c:* Then, of the silicon oxide film 86 provided on the surface of said $P^-$ layer is etched away and a silicon oxide film 92 of about 3,000 A in thickness is formed anew on the surfaces of the $P^+$ substrate 84 and of the $P^-$ layer 85, and further holes for electrode formation are provided in the new film 92 and a source, a drain and a gate electrode 93, 94, 95 are formed by Al deposition.

Now, a further method of making a transistor according to the invention as shown in FIG. 4 will be described with reference to FIGS. 7*a* through 7*c*.

In the first place, a $P^+$ substrate 101 of about 200 $\mu$ in thickness whose surfaces are cleaned neatly is prepared and $P^-$ regions 102, 105 and 106 mutually separated by spaces 103 are formed partly on the surface of the substrate 101 by epitaxially growing a $P^-$ silicon layer of about 5 $\mu$ in thickness. Then, a silicon oxide film 104 of about 3,000 – 4,000 A in thickness is formed on the surfaces of the $P^+$ substrate 101 and the $P^-$ regions 102, 105 and 106 by subjecting the assembly to heat treatment in $O_2$ atmosphere at about 1,100°C. for 20 minutes. The following steps are the same as those described in conjunction with FIGS. 5*d* through 5*f* and therefore their description is abbreviated.

EXAMPLE 2

The case where this invention is applied to a junction type field effect transistor will be described hereinbelow with reference to FIG. 8.

In FIG. 8, 111 is a $P^+$ silicon substrate of 0.002 Ω-cm in specific resistance and about 200 μ in thickness; 112 is a $P^-$ silicon epitaxial layer of 3 – 5 Ω-cm in specific resistance and about 10 μ in thickness formed on the substrate 111, the layer being divided by a ditch 116 into independent $P^-$ island regions 112', 112'', 112'''; 113 is an N-type diffused region of about 5 – 6 μ in depth formed selectively in the $P^-$ region 112'', the region providing a source, a drain and a channel (current path) regions of a transistor; 115 is a P-type diffused region of about 3 μ in depth formed in said N region 113 in continuation with said $P^-$ region 112'', the P region providing a gate region of a transistor; and 117 and 118 are a source and a drain electrodes formed in ohmic contact with the N-type region 113.

Since the N-type induced surface layer formed in the surface of the $P^-$ region 112'' is intercepted by the $P^+$ substrate 111 at the bottom of the ditch 116 also in such a junction type field effect transistor as in Example 1, the leakage current due to the induced surface layer decreases and the device works as a transistor stable against the outer atmosphere.

EXAMPLE 3

Now, an embodiment wherein this invention is applied to a P-N-P bipolar transistor will be described.

In FIG. 9, 121 is a $P^+$ silicon substrate of about 0.001 Ω-cm in specific resistance and about 200 μ in thickness; 122 is a $P^-$ collector layer of about 1 μ-cm in specific resistance and 3 μ in thickness; 123 is an N-type base region of about $10^{18}$ atoms/cm$^3$ in surface impurity concentration and about 3 μ in thickness; 124 is a P-type emitter region of about 1 – 2μ in thickness formed by selectively diffusing boron into the N region 123; 126 is a ditch or a concave part for dividing the $P^-$ layer 122 into a plurality of $P^-$ regions 122', 122'', 122'''; 125 is a silicon oxide film of about 4,000 A in thickness provided for the protection of the $P^+$ substrate and each of the regions; and 127, 128 and 129 are an emitter electrode, a base electrode and a collector electrode, respectively.

This transistor is fabricated by the following method. A $P^-$ epitaxial layer of 6 – 8 μ in thickness is formed on the $P^+$ substrate 121 and the N-type diffused layer 123 of about 3 μ in depth is formed by diffusing antimony from all the surfaces of the epitaxial layer. Then, ditches 126 are provided with a predetermined gap by conventional photo-etching technique or supersonic processing and the ditches 126 provide mutually separated $P^-$ regions 122', 122'', 122''' on the $P^+$ substrate 121. Then all the semiconductor surfaces are covered with a silicon oxide film of about 4,000 A in thickness. Holes are then provided in the film formed on the N-type diffused region 123 by conventional photo-etching technique and boron is diffused selectively through the holes and further, metal electrodes are provided.

Also in such a P-N-P transistor the surface leakage current is quite small and the operating voltage can be increased.

EXAMPLE 4

Now, an embodiment wherein this invention is applied to a semiconductor integrated circuit device will be described with reference to FIG. 10.

FIG. 10 shows an integrated circuit device wherein two insulated gate type transistors and a resistor are provided in a semiconductor substrate. In this figure, 131 is a $P^+$ silicon substrate of 0.01 Ω-cm in specific resistance and 200 μ in thickness; 132, 133 and 134 are $P^-$ type island regions or protruding regions of 3 – 5 Ω-cm in specific resistance and about 5 μ in thickness formed on the substrate 131 and separated mutually by a ditch 150; 135 and 136 are N-type diffused regions of 2 – 3 μ in depth formed by selectively diffusing impurity into the $P^-$ region 132, each of the regions composing a source and a drain regions of a first transistor $T_1$; 137 and 138 are N-type diffused regions of 2 – 3 μ in depth formed by selective diffusion of impurity into the P- region 133, each of the regions composing a source and a drain regions of a second transistor $T_2$; 139 is an N-type region of about 2 – 3 μ in depth formed in the $P^-$ region 134, the region being used as a resistor R; 140 is a silicon oxide film of 2,000 – 4,000 A in thickness formed so as to cover the surfaces of the $P^+$ substrate and the respective regions; 141, 142 and 143 are a source, a gate and a drain electrodes of the first teansistor $T_1$; 144, 145 and 146 are a source, a gate and a drain electrodes of the second transistor $T_2$, said source electrode 144 being coupled to the drain electrode 143 of the first transistor $T_1$ by conducting means; 147 and 148 are electrodes providing the two terminals of said resistor 139.

In such a semiconductor integrated circuit device according to the invention, since the induced surface layers on the surfaces of the mutually separated $P^-$ regions 132, 133 and 134 are terminated by the $P^+$ substrate at the bottom of the ditch or the space 150, the interaction or the mutual interference between each element, namely between the first transistor $T_1$, the second transistor $T_2$ and the resistor R, caused by the surface layer hardly appears. However, in an integrated circuit device shown in FIG. 10, it is preferable to operate the $P^+$ substrate 131 while maintaining it at a constant voltage. Further, though only one circuit element is formed in each of the separated $P^-$ regions in the embodiment described above, a plurality of circuit elements may be formed in one $P^-$ region without harming the effect of the invention.

It is to be noted further that a semiconductor device according to the embodiment of the invention shown in FIG. 3*a* can be used as a kind of integrated circuit device wherein two N-P diodes are installed into one semiconductor body.

Though this invention has been explained in case where a silicon oxide film is used as the insulating film covering the semiconductor regions, almost all the general insulating films including a silicon nitride film, a phosphosilicate glass film etc. have the same channeling phenomenon as the silicon oxide film. Thus, this invention is by no means restricted to a silicon oxide film, but the invention can be applied to other general insulating films.

While the invention has been particularly shown and described with reference to preferred embodiments, it will be understood by those skilled in the art that the foregoing and other changes in the form and details may be made therein without departing from the spirit and the scope of the invention.

What we claim is:

1. An insulated gate type field effect transistor comprising a P type silicon substrate having a low resistivity; a P type silicon layer formed on said substrate and having a resistivity higher than that of said substrate; a source and a drain diffused region of N type formed in said P type layer; a ditch formed in said P type layer so as to completely surround said source and drain regions and extend to said substrate to expose the surface of said substrate; an insulating film having an inherent channel producing tendency covering the entire surface of said substrate exposed by said ditch and the surfaces of said P type layer and said source and drain regions; a source and a drain electrode ohmically connected to said source and drain regions through holes formed on said insulating film, respectively; and a gate electrode formed on said insulating film covering said substrate surface between said source and drain regions, wherein the resistivity of said P type silicon substrate is sufficiently low to prevent the conductivity type of the surface of said substrate under said insulating film from inverting to N type.

2. An insulated gate field effect transistor according to claim 1, wherein the resistivity of the P type silicon substrate is not more than 0.1. Ω- cm.

3. An insulated gate field effect transitor according to claim 1, wherein the resistivity of the P type silicon substrate is not more than 0.01 Ω- cm.

4. An insulated gate field effect transistor according to claim 3, which further comprises a substrate electrode ohmically connected to the surface of said substrate opposing said P type layer.

* * * * *